United States Patent
Hirashima et al.

(10) Patent No.: US 6,309,737 B1
(45) Date of Patent: Oct. 30, 2001

(54) CIRCUIT SUBSTRATE

(75) Inventors: Yutaka Hirashima; Yoshitaka Taniguchi; Yasuhito Hushii; Yoshihiko Tujimura; Katsunori Terano; Takeshi Gotoh; Syoji Takakura; Nobuyuki Yoshino, all of Omuta; Isao Sugimoto; Akira Miyai, both of Machida, all of (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/578,451

(22) Filed: May 26, 2000

(30) Foreign Application Priority Data

May 28, 1999 (JP) .................................................. 11-149302

(51) Int. Cl.$^7$ ...................................................... B32B 3/00
(52) U.S. Cl. .......................... 428/210; 428/209; 428/901; 174/258; 174/259
(58) Field of Search .................................... 428/209, 210, 428/901; 174/250, 259, 258

(56) References Cited

U.S. PATENT DOCUMENTS

| 4,659,611 | * | 4/1987 | Iwase et al. | 428/209 |
| 4,785,092 | * | 11/1988 | Nanba et al. | 420/531 |
| 5,912,066 | * | 6/1999 | Takahashi | 428/210 |
| 5,998,041 | * | 12/1999 | Makino et al. | 428/621 |
| 6,033,787 | * | 3/2000 | Nagase et al. | 428/210 |
| 6,107,638 | * | 8/2000 | Sumino et al. | 257/43 |

* cited by examiner

Primary Examiner—Cathy Lam
(74) Attorney, Agent, or Firm—Oblon, Spivak, McClelland, Maier & Neustadt, P.C.

(57) ABSTRACT

A circuit substrate which has a ceramic substrate and an Al circuit comprising Al or an Al alloy bonded to said ceramic substrate via a layer comprising Al and Cu.

24 Claims, 1 Drawing Sheet

FIG. 1

CIRCUIT SUBSTRATE

The present invention relates to a highly reliable circuit substrate useful for e.g. power modules.

Conventionally, for semiconductor devices useful for e.g. power modules, circuit substrates having a ceramic substrate of e.g. alumina, beryllia, silicon nitride or aluminum nitride, and a circuit and a heat-radiating plate made of e.g. Cu, Al or an alloy of such a metal component, formed respectively on the front and on the back side of the ceramic substrate, have been developed (U.S. Pat. No. 5,354,415) and used practically. These circuit substrates have such a merit that high insulating properties will be obtained stably as compared with resin substrates or composite substrates of a resin substrate and a metal substrate.

Methods for bonding the circuit and the heat-radiating plate to the ceramic substrate are classified roughly into brazing employing a bonding material (i.e. brazing material) and a method of not employing a bonding material. As a representative method of the latter, DBC method of bonding alumina to a tough pitch copper plate by utilizing the Cu—O eutectic point has been known.

However, in the case where the circuit is made of Cu, the thermal stress resulting from difference in thermal expansion between the circuit and the ceramic substrate or the solder is inevitable, and thus cracks tend to form on the ceramic substrate or the solder due to repeated heat history, and no adequately high reliability will be obtained. On the other hand, when Al is selected for the material for the circuit, although it is somewhat poor in thermal conductivity and electrical conductivity as compared with Cu, the Al circuit will easily undergo plastic deformation even if thermal stress is applied thereto, whereby the stress to be applied to the ceramic substrate or the solder will be moderated, and the reliability will significantly improve.

However, the Al circuit has such a problem that it is expensive. To form an Al circuit, there are following methods: (1) a melting method in which a molten aluminum is contacted with a ceramic substrate, followed by cooling to produce a bonded product, and the thickness of the Al plate is adjusted by machine grinding, followed by etching (JP-A-7-193358, JP-A-7-27262) and (2) a method of brazing an Al foil or an Al alloy foil, followed by etching (JP-A-3-125463). Both the methods will cost from about twice to about five times as much as the case of forming a Cu circuit, and thus there is a little possibility that these methods are used widely, except for a special purpose.

Not to speak of the melting method wherein the production efficiency is poor, the major cause why the Al circuit by brazing is more costly than a Cu circuit, is that the bonding is carried out under severe conditions. Namely, the melt temperature of Al (660° C.) and the bonding temperature (from about 630 to about 650° C. in the case of an Al—Si type which is the commonest bonding material) are close, whereby Al is likely to melt locally to cause soldering defects (moth-eaten phenomenon formed on the Al circuit), and thus considerable skill and labor are required to produce the Al circuit while preventing such defects.

Under these circumstances, the present inventors have found that an Al circuit can be easily formed on a ceramic substrate by bonding under specific conditions by using, as a bonding material, a low-priced Al—Cu type alloy which has attracted no attention, and they have further conducted extensive studies to accomplish the present invention.

It is an object of the present invention to provide a circuit substrate which has a ceramic substrate and an Al or Al alloy circuit formed on the ceramic substrate, at a low cost while keeping its high reliability. Particularly, it is to provide a highly reliable circuit substrate wherein not only cracks on a solder or the ceramic substrate but also peeling of a bonding wire or plating is significantly prevented.

Another object of the present invention is to produce such a highly reliable circuit substrate easily.

Namely, the present invention resides in a circuit substrate and a process for producing the circuit substrate, which have the following essential features.

1. A circuit substrate which has a ceramic substrate and an Al circuit comprising Al or an Al alloy bonded to said ceramic substrate via a layer comprising Al and Cu.
2. A circuit substrate which has a ceramic substrate and an Al circuit comprising Al or an Al alloy bonded to said ceramic substrate by using, as a bonding material, an Al—Cu type alloy or a mixture containing Al and Cu.
3. The circuit substrate according to Item 2, wherein the bonding material is an Al—Cu type alloy foil.
4. The circuit substrate according to Item 1, 2 or 3, wherein the ceramic substrate is an aluminum nitride substrate or a silicon nitride substrate.
5. The circuit substrate according to any one of Items 1 to 4, wherein the ceramic substrate is an aluminum nitride substrate having a thermal conductivity of at least 130 W/mK and having such a X-ray diffraction peak intensity ratio that $2 \leq Y_2O_3 \cdot Al_2O_3 \times 100/AlN \leq 17$ and $2Y_2O_3 \cdot Al_2O_3 \times 100/AlN \leq 2$ on the surface.
6. The circuit substrate according to any one of Items 1 to 5, wherein the Al circuit comprising Al or an Al alloy is formed by using Al having a purity of at least 99.85 wt %.
7. The circuit substrate according to any one of Items 1 to 6, wherein the Al circuit comprising Al or an Al alloy is formed by using a rolled Al having a purity of at least 99.99 wt %.
8. The circuit substrate according to Item 1, wherein the proportion of Cu in the layer comprising Al and Cu is from 1 to 6 wt %.
9. The circuit substrate according to Item 2 or 3, wherein the bonding material comprises at least 86 wt % of Al, from 1 to 6 wt % of Cu and at most 3 wt % of Mg (not including O).
10. The circuit substrate according to any one of Items 1 to 9, wherein the Al circuit comprising Al or an Al alloy has a thickness of at least 100 μm and a Vickers hardness of at most 15 kgf/mm².
11. The circuit substrate according to any one of Items 1 to 10, which has a heat-radiating plate comprising Al or an Al alloy formed on the ceramic substrate on the side (back side) opposite to the side on which the Al circuit is formed.
12. The circuit substrate according to Item 11, wherein the volume ratio of the Al circuit to the heat-radiating plate is from 0.80 to 1.2.
13. The circuit substrate according to Item 11 or 12, wherein the Al circuit has a Vickers hardness of at most 16 kgf/mm², and the heat-radiating plate has a Vickers hardness of from 19 to 30 kgf/mm².
14. A process for producing a circuit substrate, which comprises disposing an Al or Al alloy plate, pattern or both on a ceramic substrate by means of, as a bonding material, an Al—Cu type alloy or a mixture containing Al and Cu, and heating the resulting assembly at a temperature of from 540 to 640° C. while applying a pressure of from 1 to 100 kgf/cm² thereto in a direction perpendicular to the ceramic substrate to bond the Al or Al alloy plate, pattern or both to the ceramic substrate, followed by etching as the case requires.
15. The process for producing a circuit substrate according to Item 14, wherein the bonding material is an Al—Cu type alloy foil.
16. The process for producing a circuit substrate according to Item 15, wherein the bonding material is an Al—Cu type alloy foil having a thickness of from 15 to 35 μm, the Al or Al alloy plate, pattern or both, having a thickness of at least 100 μm, is disposed on either side of the ceramic substrate by means of said bonding material, and the resulting assembly is held under heating at a temperature of at least 590° C. for at least 20 minutes while applying a pressure of from 8 to 50 kgf/cm² thereto in a direction perpendicular to the ceramic substrate.

17. The process for producing a circuit substrate according to Item 15 or 16, wherein the Al—Cu type alloy foil is an Al—Cu—Mg type alloy foil comprising at least 86 wt % of Al, from 1 to 6 wt % of Cu and at most 3 wt % of Mg (not including O).

Now, the present invention will be described in detail with reference to the preferred embodiments.

The present invention is greatly characterized by that an Al circuit or an Al alloy circuit (hereinafter both will be referred to as Al circuit) is formed on at least one side of a ceramic substrate via a layer comprising Al and Cu. In other words, an Al circuit is bonded to at least one side of a ceramic substrate by using, as a bonding material, an Al—Cu type alloy or a mixture containing Al and Cu. The circuit substrate of the present invention may have such a structure that a heat-radiating plate is formed on the ceramic substrate on the side (back side) opposite to the side on which the Al circuit is formed.

Heretofore, as the bonding material for the Al circuit, an Al—Si type alloy has been most well known, and some studies have been made on e.g. an Al—Si—Mg type, an Al—Ge type and an Al—Si—Ge type. However, no prior art has been found wherein an Al—Cu type alloy is used as the bonding material. It is considered that the Al—Cu type alloy has attracted no attention, since it is relatively hard and fragile, which prepossessed users against it to be disadvantageous to plastic deformation which will release thermal stress of the circuit substrate.

However, from the viewpoint of easiness in bonding of the Al circuit, the Al—Cu type alloy is absolutely favorable as compared with an Al—Si type, an Al—Ge type or a type having Mg added thereto, since Cu is likely to diffuse uniformly in Al as compared with Si or Ge, and thus no local melting nor spewing of superfluous bonding material is likely to result, and accordingly the bonding can be carried out stably in a relatively short time.

Further, as an alloy of AA symbol series 2000, it is widely used as a high-strength Al alloy or as a heat-resistant Al alloy, and it is easily formed into a foil, such being favorable in view of cost also.

In the circuit substrate of the present invention, an Al circuit is bonded to a ceramic substrate via a layer comprising Al and Cu. Such a layer is constituted by a layer which contains at least the two components of Al and Cu, and may further contain a third component. As the third component, e.g. Mg, Zn, In, Mn, Cr, Ti or Bi may, for example, be contained in a total amount of at most about 5 wt %. Among them, Mg is preferred.

The layer comprising Al and Cu is located on the ceramic substrate preferably within 100 μm from the surface of the ceramic substrate. Between the Al circuit and the layer comprising Al and Cu, a third layer may or may not be present.

The layer comprising Al and Cu is formed in such a manner that on a ceramic substrate, an Al or Al alloy plate, pattern or both is disposed by means of an Al—Cu type bonding material, followed by bonding under heating while applying pressure thereto.

As the bonding material, an Al—Cu type alloy or a mixture containing Al and Cu is used. Among them, preferred is an Al—Cu type alloy foil, particularly an alloy foil having a thickness of from 1/10 to 1/50 of the thickness of the Al circuit. If the thickness is less than 1/50, no adequate bonding will be carried out, and if it exceeds 1/10, the Al circuit tends to be hard, such being unfavorable to the heat history of the circuit substrate. The thickness is particularly preferably at most 100 μm, and from 1/12 to 1/40 of the thickness of the Al circuit. As an Al circuit having a thickness of from 0.4 to 0.6 mm is usually used, the thickness of the bonding material is from 10 to 50 μm, particularly from about 15 to about 30 μm.

The bonding material comprises preferably at least 86 wt % of Al, from 1 to 6 wt % of Cu, and at most 3 wt %, particularly from 0.2 to 2.0 wt %, of Mg (not including O).

To obtain a further highly reliable circuit substrate, the Al—Cu type alloy comprises preferably at least 86 wt % of Al, from 1 to 6 wt % of Cu and at most 3 wt % of Mg (not including O). If the content of Cu is less than 1 wt %, the bonding temperature tends to be high and close to the melting point of Al, and if it exceeds 6 wt %, Cu tends to diffuse in the Al circuit after the bonding, such being unfavorable to the heat history of the circuit substrate. The content of Cu is preferably from 1.5 to 5 wt %.

The content of Cu in the layer comprising Al and Cu is determined substantially by the content of Cu in the bonding material to be used for the bonding.

When Mg is added, the characteristics of the Al—Cu type alloy will be exploited, and the adhesion of the Al circuit to the ceramic substrate will be improved.

The mechanism how the effects by Mg addition appear is not clearly understood in detail. However, it is estimated that Mg reacts with an oxide layer on the surface of Al to form MgO and to remove the oxide layer, and $MgN_2$ is formed on the surface of the ceramic substrate, whereby the wettability will improve.

If the content of Mg exceeds 3 wt %, Mg will evaporate in large quantities during the bonding operation so that e.g. the Al circuit may be broken, or Mg will diffuse in large quantities in the Al circuit so that Al may undergo significant curing. If the content of Mg is too low, the effect to improve the adhesion tends to be small, and accordingly, the content of Mg is preferably from 0.2 to 2.0 wt %.

Further, a fourth content such as Zn, In, Mn, Cr, Ti, Bi, B or Fe may be incorporated in a total amount of at most about 5 wt %. By using a bonding material having such a composition, a circuit substrate will be provided more stably at a lower cost.

Specific examples (commercially available alloys) of the bonding material include an Al—Cu alloy having a Cu content of from 1 to 6 wt %, 2018 alloy containing about 4 wt % of Cu and about 0.5 wt % of Mg, 2017 alloy containing about 0.5 wt % of Mn, and JIS alloys 2001, 2003, 2005, 2007, 2011, 2014, 2024, 2025, 2030, 2034, 2036, 2048, 2090, 2117, 2124, 2218, 2224, 2324 and 7050.

Now, the Al circuit will be explained.

As the material for the Al circuit, in addition to 1000 series pure Al, 4000 series Al—Si type alloys with which the bonding is easily carried out, and 6000 series Al—Mg—Si type alloys may be used. Among them, preferred is a high purity Al (purity: at least 99.85 wt %) having a low breakdown proof stress. Such an Al plate is commercially available as 1085 or 1N85 material. Further, an Al having a purity of 99.9 wt % (3N), an Al having a purity of 99.99 wt % (4N) and an Al having a purity of 99.999 wt % (5N) may be used since they are not so expensive.

The Al circuit may be a simple substance or a laminate such as a clad of at least two kinds. Examples of the laminate include Al—Ni, Al—Ni—Cu, Al—Mo, Al—W and Al—Cu. They may be optionally selected according to the purpose of use and the bonding method. However, it is preferred to use a rolled plate of an Al simple substance having a purity of at least 99.99 wt %, particularly a rolled plate having a reduction ratio of at least 10%. The reason why a rolled Al plate is preferred is that uniform rolling will be carried out repeatedly by a roll, whereby uniform plastic deformation is likely to result, as compared with the above melting aluminum method.

The thickness of the Al circuit is usually from 0.3 to 0.5 mm. If it significantly departs from this range, the above preferred relation to the thickness of the bonding material is less likely to be maintained. For example, when the thickness of the Al circuit is 3 mm, the thickness of an alloy foil of 200 µm which is 1/15 of the thickness of the Al circuit, is not appropriate, and a hard layer unfavorable to the heat history tends to be formed.

Further, of the Al circuit, the thickness is preferably at least 100 µm and the Vickers hardness is preferably at most 15 kgf/mm$^2$, so as to optimize the hardness of the Al circuit to achieve relatively uniform plastic deformation, to prevent peeling of a bonding wire and plating, and to significantly reduce damages such as solder cracks.

The thickness of at least 100 µm of the Al circuit is a necessary condition to obtain a diffusion distance of the bonding material of about several tens µm and to make the Vickers hardness of the Al circuit at most 15 kgf/mm$^2$. If the Vickers hardness exceeds 15 kgf/mm$^2$, the plastic deformation tends to be non-uniform when the Al circuit is subjected to thermal stress, whereby partial deformation tends to be significant, and plating or a bonding wire tends to peel, or damages such as solder cracks tend to be significant. The lower limit of the Vickers hardness is not particularly limited, and the smaller, the better. However, it is preferably from 10 to 14 kgf/mm$^2$, since the Al circuit tends to be damaged if it is too soft.

With respect to a circuit substrate having an Al circuit formed thereon, in order to increase the reliability, proposes have been conventionally made such as a plating composition (JP-A-8-260187), modification of the surface of the ceramic substrate (JP-A-8-260186) and a particle size definition of the Al plate (JP-A-8-156330). However, they are not satisfactory solvents. On the other hand, according to the present invention, the problems can easily be overcome by optimizing the thickness and the Vickers hardness of the Al circuit.

With respect to a circuit substrate having such a structure that a heat-radiating plate is formed on the opposite side (back side) of the ceramic substrate, it is preferred to make the volume ratio of the Al circuit to the heat-radiating plate (the volume of the circuit/the volume of the heat-radiating plate) in the vicinity of 1, in order to minimize warps and swells due to thermal stress, and to adequately prevent damages such as solder cracks and peeling of a bonding wire and plating. Said ratio is preferably from 0.80 to 1.2, particularly preferably from 0.85 to 1.15, furthermore preferably from 0.90 to 1.1. In such a case, the thickness of the heat-radiating plate is preferably equal to or less than the thickness of the circuit.

The volume of the Al circuit and the volume of the heat-radiating plate are calculated from formulae (circuit area)×(circuit thickness) and (heat-radiating plate area)×(heat-radiating plate thickness), respectively.

Also in the case where the volume ratio is as mentioned above, the Vickers hardness of the Al circuit is particularly preferably at most 16 kgf/mm$^2$, and the Vickers hardness of the heat-radiating plate is particularly preferably from 19 to 30 kgf/mm$^2$.

The Vickers hardness is the hardness of the Al circuit or the heat-radiating plate, and different from the hardness of an Al plate before the bonding. The Al plate is bonded to a ceramic substrate by using the bonding material and by heating at a temperature of from 500 to 640° C. Accordingly, the microstructure may change due to the heat treatment, and the bonding material may diffuse to decrease the Al purity. Further, heat treatment may be carried out after the bonding, whereby the Al properties will change. Accordingly, it has little significance to strictly define the hardness of the Al plate before the bonding.

The Vickers hardness is obtained by a method of pitching a fine indentater while applying a load thereto to measure the hardness, which is widely used as a method for measuring the hardness of metals and ceramics. Slightly different values may be obtained depending upon the measuring conditions. Accordingly, in the present invention, the measuring is carried out at a load of 1 kgf for a holding time of 15 seconds.

Now, the ceramic substrate will be explained.

As the material for the ceramic substrate, aluminum nitride or silicon nitride having a thermal conductivity of at least 70 W/mK is suitably used from the viewpoint that it is used for power modules which require a high reliability. Silicon carbide, beryllium oxide or the like may be used, however, they are poor in insulating properties and safety.

The ceramic substrate suitable for the present invention is an aluminum nitride substrate having a thermal conductivity of at least 130 W/mK and having such a X-ray diffraction peak intensity ratio that $2 \leq Y_2O_3 \cdot Al_2O_3 \times 100/AlN \leq 17$ and $2Y_2O_3 \cdot Al_2O_3 \times 100/AlN \leq 2$ on the surface by Cu—Kα ray. By using said aluminum nitride substrate, the bonding strength by the above Al—Cu type bonding material will increase, and a further highly reliable circuit substrate will be obtained.

Such an aluminum nitride substrate can be formed by using (a) an aluminum nitride powder material comprising from 1 to 10 wt % of coarse particles having sizes of not smaller than 100 µm and from 10 to 50 wt % of fine particles having sizes of not larger than 1 µm, as measured by laser diffraction scattering method, and by optimizing e.g. (b) the composition ratio of the $Al_2O_3$ content and the $Y_2O_3$ content in the aluminum nitride powder material, (c) the amount of oxygen increased after removal of a binder till before sintering and (d) the sintering temperature.

In a case where the $2Y_2O_3 \cdot Al_2O_3$ content is high, for example, the $Al_2O_3$ content has to be relatively increased, and accordingly an aluminum nitride powder material containing a large amount of oxygen is used, or $Al_2O_3$ is added, to decrease the $Y_2O_3$ content. On the other hand, in a case where the $Y_2O_3 \cdot Al_2O_3$ content is high, the addition amount of $Y_2O_3$ is reduced, or the sintering temperature is lowered. Further, the $Al_2O_3$ content may be increased by carrying out removal of a binder in the air.

As the sintering aid, a powder of e.g. yttria, alumina, magnesia or an oxide of a rare earth element, is incorporated in the aluminum nitride powder material in an amount of from about 0.5 to about 10 wt % based on the powder material. Forming is carried out by using an organic binder such as butyral or methylcellulose, and after removal of the binder, sintering is carried out by holding the formed product in a non-oxidizing atmosphere of e.g. nitrogen or argon at a temperature of from 1700 to 1900° C. for from 1 to 12 hours.

The thickness of the ceramic substrate is usually 0.635 mm, but it can be changed according to the properties required. For example, in a case where heat resistance is important and insulating properties at a high voltage are not so important, a thin substrate of from 0.5 to 0.3 mm may be used. On the other hand, in a case where insulating pressure resistances at a high voltage or partial discharge properties are important, a thick substrate of from 1 to 3 mm may be used.

Now, the process for producing the circuit substrate of the present invention will be explained.

The circuit substrate of the present invention is formed by e.g. a method of bonding an Al plate or an Al alloy plate to a ceramic substrate by using the above Al—Cu type bonding material under heating, followed by etching, or a method of bonding a circuit pattern punched out of an Al plate or an Al alloy plate to a ceramic substrate by using the above Al—Cu type bonding material.

In either case, the bonding temperature is within a range of from 540 to 640° C. However, the proper range is different depending upon the composition of the bonding material. In a case where the component having a relatively low melting point such as Zn or In is incorporated, or the content of e.g. Cu or Mg is relatively high, the bonding will be satisfactorily carried out at a temperature of at most 600° C. On the other hand, if the bonding temperature exceeds 640° C., soldering defects (moth-eaten phenomenon formed on the Al circuit) are likely to result. Further, it is preferred to apply a pressure of from 1 to 100 kgf/cm$^2$ in a direction perpendicular to the ceramic substrate during the bonding.

In conventional production of the circuit substrate, when the metal plate is bonded to the ceramic substrate, a pressure is applied thereto by putting a weight thereon. However, the pressure is at most about 0.1 kgf/cm$^2$, and with a pressure at this level, the metal plate will follow only relatively mild warps and undulations. On the other hand, in the present invention, a high pressure of from 1 to 100 kgf/cm$^2$, which is extravagantly high in the prior art, is applied.

Accordingly, a standard ceramic substrate will be used directly without requiring strict smoothness and flatness, thus the productivity will improve. Since the ceramic substrate has a high compressive strength, it is hardly damaged by the pressure at this level. However, as a ceramic substrate usually has a few warps and undulations, there is a risk of being split if a pressure exceeding 50 kgf/cm$^2$, particularly a pressure exceeding 100 kgf/cm$^2$, is applied thereto, and thus the operation has to be carried out cautiously.

Al or an Al alloy itself is a very soft metal at a temperature of at least 500° C., as evident from the fact that it is annealed at a temperature of from 300 to 350° C. Accordingly, even if the soldering defects are formed in the bonding, they will be crushed and disappear by applying a pressure of from 1 to 100 kgf/cm$^2$ thereto. Accordingly, when it is important to minimize the soldering defects, the bonded product is reheated at a temperature of at least 400° C. while applying pressure thereto after the bonding, or a pressure is applied thereto at a temperature of at least 400° C. in a cooling step after the bonding.

The pressure is applied in a direction perpendicular to the ceramic substrate, and the method or the like is not particularly limited. A method of putting a weight thereon, or a method of mechanically sandwiching the substrate by using e.g. a jig, may, for example, be employed.

The bonding material is an Al—Cu type alloy or a mixture containing Al and Cu, preferably an Al—Cu type alloy foil, more preferably an Al—Cu—Mg type alloy foil comprising at least 86 wt % of Al, from 1 to 6 wt % of Cu and at most 3 wt % (particularly from 0.2 to 2.0 wt %) of Mg (not including O). Further, a paste comprising a powder of this alloy or a metal powder mixture having this alloy composition and an organic binder and a solvent, may be used. In this case, the operation has to be carried out carefully so that the metal is not oxidized, and the amount of oxygen in the metal powder is adjusted to be at most 1 wt %, particularly at most 0.8 wt %. Further, in order to maintain the above mentioned relation in thickness to the Al circuit, the thickness of the bonding material is calculated as the thickness of the alloy foil. Namely, a thickness of 100 µm of a paste layer having a bulk density of 50% corresponds to a thickness of 50 µm of an alloy foil.

The bonding material may be disposed either on the ceramic substrate or on the metal plate or the circuit pattern. Further, the metal plate or the circuit pattern may be preliminarily cladded in the alloy foil.

Then, the bonded product is etched, as the case requires. When a pattern of a circuit or a heat-radiating plate is bonded, etching is not particularly required. Etching may be carried out by a conventional resist etching process. Further, a surface treatment such as plating may be carried out, as the case requires.

The preferred conditions for the bonding in the present invention are such that an Al—Cu type alloy foil having a thickness of from 15 to 35 µm is used as the bonding material, the pressure applied is from 8 to 50 kgf/cm$^2$, the bonding temperature is at least 590° C., and the holding time is at least 20 minutes under this pressure at this bonding temperature, whereby the Vickers hardness of the Al circuit can easily be made at most 16 kgf/cm$^2$. More preferably, the holding is carried out at a temperature of from 595 to 635° C. for from 20 to 90 minutes.

The mechanism how the Vickers hardness reduces in the present invention is not clearly understood in detail. It is considered that since the bonding in the present invention is carried out at an extravagantly high temperature as compared with the conventional annealing temperature of from 300 to 350° C., Al is in a very soft state, whereby the pressure is likely to be transmitted uniformly, and thus the particle growth is suppressed.

Now, the present invention will be described in further detail with reference to Examples. However, it should be understood that the present invention is by no means restricted to such specific Examples.

EXAMPLES 1 TO 6 AND COMPARATIVE EXAMPLES 1 TO 3

As an aluminum nitride substrate, a sintered one was directly used without post-processing such as surface polishing or curing of warps, and it had a thickness of 0.635 mm, a size of 2 inches square, a thermal conductivity of 170 W/mK and a bending strength of 400 MPa. Further, as an Al plate for forming an Al circuit, JIS1090 (thickness: 0.5 mm, Al purity: 99.9 wt %) was used.

Firstly, Al plates were overlaid on the front and the back of the aluminum nitride substrate by means of a bonding material, and the resulting assembly was sandwiched between C—C composite plates (thickness: 2 mm) and heated at a temperature of from 550 to 620° C. under vacuum or in $N_2$ while applying pressure thereto uniformly in a direction perpendicular to the ceramic substrate by a hot press apparatus.

As the bonding material, one of (a) an Al-9.5 wt % Si-1 wt % Mg alloy foil, (b) an Al-15 wt % Ge alloy foil, (c) an Al-4.1 wt % Cu-0.5 wt % Mn alloy foil, (d) an Al-2.8 wt % Cu alloy foil, and (e) a paste comprising a powder obtained by atomizing the above alloy foil (c) in $N_2$ to the average particle size of 10 µm and an organic binder (PIBMA) and a solvent (terpineol), was used.

100 bonded products were prepared in each Example, and bonding failures and soldering defects were inspected under three times magnification by using soft X-rays. The lower limit of detection was about 0.3 mm in diameter. Further, products were selected in each Example, and etching was carried out by a $FeCl_3$ liquid within 2 mm from the periphery of either Al plate on each product, electroless Ni—P plating was applied thereto in a thickness of 3 µm on either side, and then two silicon chips of 12.5 mm square were soldered on the center portion on the front side by an eutectic solder, and the opposite side was soldered to an Al/SiC heat sink. The soldering thickness was 150 µm on either side.

Then, heat history test for 3000 cycles and 5000 cycles, each cycle consisting of 30 minutes at −40° C., minutes at room temperature, 30 minutes at 125° C. and 10 minutes at room temperature, was carried out, and flaws in appearance such as blisters and peelings were checked, and the presence or absence of solder cracks were inspected by observing cross sections of three circuit substrates. Then, the circuit portion of each of seven circuit substrates was dissolved to measure the presence or absence of cracks by ink test method (red check). The results are shown in Table 1.

EXAMPLE 7 AND COMPARATIVE EXAMPLE 4

Circuit substrates were produced in the same manner as in Example 2 or comparative Example 2, except that a silicon nitride substrate (thickness: 0.635 mm, size: 2 inches square, thermal conductivity: 70 W/mK, bending strength: 800 MPa) was used instead of the aluminum nitride substrate. The obtained circuit substrates were evaluated in the same manner as in Example 1. The results are shown in Table 1.

inches square, thermal conductivity: 175 W/mK, three-point bending strength: 420 MPa) by means of a bonding material, and a pressure was applied thereto in a direction perpendicular to the aluminum nitride substrate by using a jig wherein carbon plates were screwed and pressed on the substrate. Bonding conditions are shown in Table 2. As the bonding material, (f) an Al-3.9 wt %Cu alloy foil or (g) a paste obtained in such a manner that the alloy foil (f) was atomized in $N_2$ to the average particle size of 9 $\mu$m, the obtained particles having sizes of 45 $\mu$m or smaller were collected, and an organic binder and a solvent were added thereto to obtain a paste, was used.

After the bonding, etching resists were printed by screen printing, followed by etching by a $FeCl_3$ liquid. Patterns for

TABLE 1

| | | Bonding material | | Bonding condition | | Bonded product (number of failures per 100 products) | | After 3000 cycles | | After 5000 cycles | |
|---|---|---|---|---|---|---|---|---|---|---|---|
| | Ceramic substrate | Composition | Thickness ($\mu$m) | Pressure (kgf/cm$^2$) | Atmosphere | Bonding failure | Soldering defect | Solder crack | Substrate crack | Solder crack | Substrate crack |
| Ex. | | | | | | | | | | | |
| 1 | AlN | (c) | 45 | 2 | Vacuum | 1/100 | 0/100 | 0/3 | 0/7 | 2/3 | 3/7 |
| 2 | AlN | (c) | 25 | 10 | In $N_2$ | 0/100 | 0/100 | 0/3 | 0/7 | 1/3 | 1/7 |
| 3 | AlN | (c) | 15 | 30 | Vacuum | 0/100 | 0/100 | 0/3 | 0/7 | 1/3 | 1/7 |
| 4 | AlN | (d) | 30 | 5 | In $N_2$ | 0/100 | 0/100 | 0/3 | 0/7 | 1/3 | 2/7 |
| 5 | AlN | (d) | 40 | 3 | Vacuum | 0/100 | 1/100 | 0/3 | 0/7 | 2/3 | 4/7 |
| 6 | AlN | (e) | 20 | 20 | Vacuum | 0/100 | 0/100 | 0/3 | 0/7 | 1/3 | 1/7 |
| 7 | Si3N4 | (c) | 25 | 10 | In $N_2$ | 0/100 | 0/100 | 0/3 | 0/7 | 0/3 | 0/7 |
| Comp. Ex. | | | | | | | | | | | |
| 1 | AlN | (a) | 50 | 0.5 | Vacuum | 15/100 | 4/100 | 0/3 | 2/7 | 3/3 | 7/7 |
| 2 | AlN | (b) | 30 | 2 | Vacuum | 0/100 | 6/100 | 2/3 | 0/7 | 3/3 | 7/7 |
| 3 | AlN | (b) | 20 | 110 | Vacuum | 2/100 | 8/100 | 0/3 | 3/7 | 3/3 | 7/7 |
| 4 | Si3N4 | (b) | 30 | 2 | Vacuum | 1/100 | 7/100 | 2/3 | 0/7 | 3/3 | 7/7 |

As evident from Table 1, in Examples 1 to 7 of the present invention, the bonding state was excellent, and circuit substrates were stably produced even in $N_2$, whereas in Comparative Examples 1 to 4, many failures occurred, and the productivity was poor. Further, surprisingly, properties in Examples of the present invention were equal to those in Comparative Examples.

Further, the alloy foils (a) and (b) used in Comparative Examples have a composition as described in JP-A-3-125463, but they are custom-made and not on the market as alloy foils, and thus they are hardly available. On the other hand, the alloy foil (c) used in Examples is a commercial product made by forming 2017 alloy into a foil, and it is available easily at a low cost.

EXAMPLES 8 TO 12

Al plates (purity: at least 99.99 wt %, thickness: shown in Table 2) were overlaid on the front and the back of an aluminum nitride substrate (thickness: 0.635 mm, size: 2 an Al circuit and a heat-radiating plate were squares (corner R: 2 mm), which were formed on the center portion of the ceramic substrate. Their sizes were variously changed to adjust the volume ratio of the Al circuit to the heat-radiating plate as shown in Table 2. Then, the resists were taken off, and electroless Ni—P plating was applied in a thickness of 3 $\mu$m on either side to obtain a circuit substrate.

The Vickers hardness of the obtained circuit substrate was measured. Then, an Al wire of 300 $\mu$m was bonded thereto by supersonic waves, and a Si chip of 13 mm square was soldered on the center portion. Then such samples were prepared, and subjected to heat cycle test in the same manner as in Example 1. After the test, the presence or absence of peeling of the bonding wire or damages such as solder cracks, was inspected, and then, the circuits and the heat-radiating plates were dissolved with hydrochloric acid to observe the presence or absence of cracks on the aluminum nitride substrates. The results are shown in Table 3.

TABLE 2

| Ex. | Bonding material | Thickness of Al plate ($\mu$m) | Bonding condition | Volume ratio (Al circuit)/ (heat-radiating plate) |
|---|---|---|---|---|
| 8 | (f) Thickness: 25 $\mu$m | 300 | 605° C., 30 min., in $N_2$, 20 kgf/cm$^2$ | 1.1 |
| 9 | (g) Thickness: 35 $\mu$m | 500 | 620° C., 60 min., in $N_2$, 10 kgf/cm$^2$ | 0.9 |
| 10 | (f) Thickness: 20 $\mu$m | 200 | 600° C., 70 min., in $N_2$, 40 kgf/cm$^2$ | 0.8 |

TABLE 2-continued

| Ex. | Bonding material | Thickness of Al plate (μm) | Bonding condition | Volume ratio (Al circuit)/ (heat-radiating plate) |
|---|---|---|---|---|
| 11 | (f) Thickness: 15 μm | 150 | 610° C., 50 min., in N₂, 50 kgf/cm² | 1.2 |
| 12 | (f) Thickness: 35 μm | 400 | 595° C., 20 min., in N₂, 3 kgf/cm² | 1.3 |

TABLE 3

| | Vickers hardness of Al circuit | Peeling evaluation | | After 3000 cycles | | After 5000 cycles | |
|---|---|---|---|---|---|---|---|
| Ex. | (kgf/mm²) | Wire bonding | Plating | Solder crack | Substrate crack | Solder crack | Substrate crack |
| 8 | 13.7 | Peeling 0/10 | No peeling | 0/10 | 0/10 | 0/10 | 0/10 |
| 9 | 14.4 | Peeling 0/10 | No peeling | 0/10 | 1/10 | 0/10 | 3/10 |
| 10 | 12.9 | Peeling 0/10 | No peeling | 0/10 | 0/10 | 2/10 | 0/10 |
| 11 | 13.2 | Peeling 0/10 | No peeling | 0/10 | 0/10 | 2/10 | 0/10 |
| 12 | 15.0 | Peeling 0/10 | No peeling | 0/10 | 1/10 | 3/10 | 3/10 |

As evident from Tables 2 and 3, the bonding wire and the plating were not damaged even after the heat cycle test for 5000 cycles, and the cracks on the solder and the aluminum nitride substrate could be minimized, by making the thickness of the Al circuit at least 100 μm and the Vickers hardness at most 15 kgf/mm². Particularly, as evident from the comparison between Examples 8, 10 and 11 and Examples 9 and 12, the above effects became significant when the thickness of the Al circuit was from 150 to 300 μm, and the volume ratio of the Al circuit to the heat-radiating plate (circuit volume/heat-radiating plate volume) was from 0.80 to 1.2.

EXAMPLES 13 TO 18

Circuit substrates were produced by using the aluminum nitride substrate used in Example 1, in the same manner as in Example 1 except that the Al plate (commercially available product), the bonding material and the bonding conditions were as shown in Table 4, and evaluations were carried out in the same manner as in Example 1. The results are shown in Table 5.

TABLE 5

| | Bonding failure | After 3000 cycles | | After 5000 cycles | |
|---|---|---|---|---|---|
| Ex. | (number of failures per 100 products) | Solder crack | Substrate crack | Solder crack | Substrate crack |
| 13 | 0/100 | 0/3 | 1/7 | 0/3 | 3/7 |
| 14 | 0/100 | 0/3 | 0/7 | 0/3 | 1/7 |
| 15 | 0/100 | 0/3 | 0/7 | 0/3 | 0/7 |
| 16 | 0/100 | 0/3 | 0/7 | 0/3 | 2/7 |
| 17 | 0/100 | 0/3 | 0/7 | 0/3 | 1/7 |
| 18 | 0/100 | 1/3 | 1/7 | 2/3 | 4/7 |

As evident from the comparison between Table 1 and Tables 4 and 5, by using, as the bonding material, one comprising at least 86 wt % of Al, from 1 to 6 wt % of Cu and at most 3 wt % of Mg (not including O), circuit substrates showing an excellent bonding state without e.g. voids, having substantially no solder cracks nor cracks on the aluminum nitride substrate even after the heat cycle test for 5000 cycles, and having a high durability against heat history, could be produced.

TABLE 4

| | Bonding material | | Al plate | | Bonding condition | |
|---|---|---|---|---|---|---|
| Ex. | Composition | Thickness (mm) | Purity (wt %)* | Thickness (mm) | Pressure (kgf/cm²) | Temp., Time |
| 13 | 93.8 wt % Al-5.0 wt % Cu-1.2 wt % Mg | 0.02 | 99.85 | 0.4 | 10 | 600° C., 30 min. |
| 14 | 94.5 wt % Al-4.0 wt % Cu-1.0 wt % Mg-0.5 wt % Mn | 0.025 | 99.90 | 0.4 | 20 | 615° C., 25 min. |
| 15 | 96.2 wt % Al-3.0 wt % Cu-0.8 wt % Mg | 0.03 | 99.99 | 0.5 | 50 | 625° C., 20 min. |
| 16 | 97.4 wt % Al-2.0 wt % Cu-0.6 wt % Mg | 0.035 | 99.99 | 0.5 | 45 | 635° C., 60 min. |
| 17 | 95.7 wt % Al-3.5 wt % Cu-0.5 wt % Mg-0.3 wt % Si | 0.04 | 99.999 | 0.5 | 30 | 605° C., 15 min. |
| 18 | 94.1 wt % Al-5.5 wt % Cu-0.4 wt % Mg | 0.015 | 99.85 | 0.3 | 12 | 595° C., 10 min. |

*Guaranteed performance. A rolled Al plate was used in Examples 15, 16 and 17.

Further, as evident from the comparison between Examples 13 and 18 and Examples 14 to 17, along with the increase in the Al plate purity, the number of failures due to substrate cracks tended to decrease even after the heat cycle test for 5000 cycles. Particularly, as evident from the comparison between Example 14 and Example 15, the above effect became significant when a rolled Al plate having a purity of at least 99.99 wt % was used.

The reason why the best effect was obtained in Example 15 is that the thickness of the bonding material was optimized. From the comparison between Example 16 and Example 17, in Example 17, the bonding material was thick, such being unfavorable to prevention of the substrate cracks, however, the Al plate purity was high, whereby the number of the substrate cracks was smaller than that of Example 16.

EXAMPLES 19 TO 21

Production of Aluminum Nitride Substrate $Y_2O_3$ was mixed with a commercially available aluminum nitride powder in a proportion as shown in Table 6, an organic binder and an organic solvent were added thereto, followed by kneading, and the mixture was formed into a sheet by a roll forming machine. The sheet was cut, a releasing material (BN powder) was coated thereon, the cut sheets were laminated one on another, the binder was removed at 450° C. under a reduced pressure of about 1 Pa, and further, decarbonization was carried out in the air. Each sample was baked in $N_2$ atmosphere under baking conditions as shown in Table 6, to produce an aluminum nitride substrate 4 having a size of 40 mm×40 mm and a thickness of 0.635 mm. With respect to the obtained aluminum nitride substrate, the intensity peak ratio on the surface was measured by X-ray diffraction, and the thermal conductivity was obtained by laser flash method. The results are shown in Table 6.

Production of Circuit Substrate Composite

Figure 1:
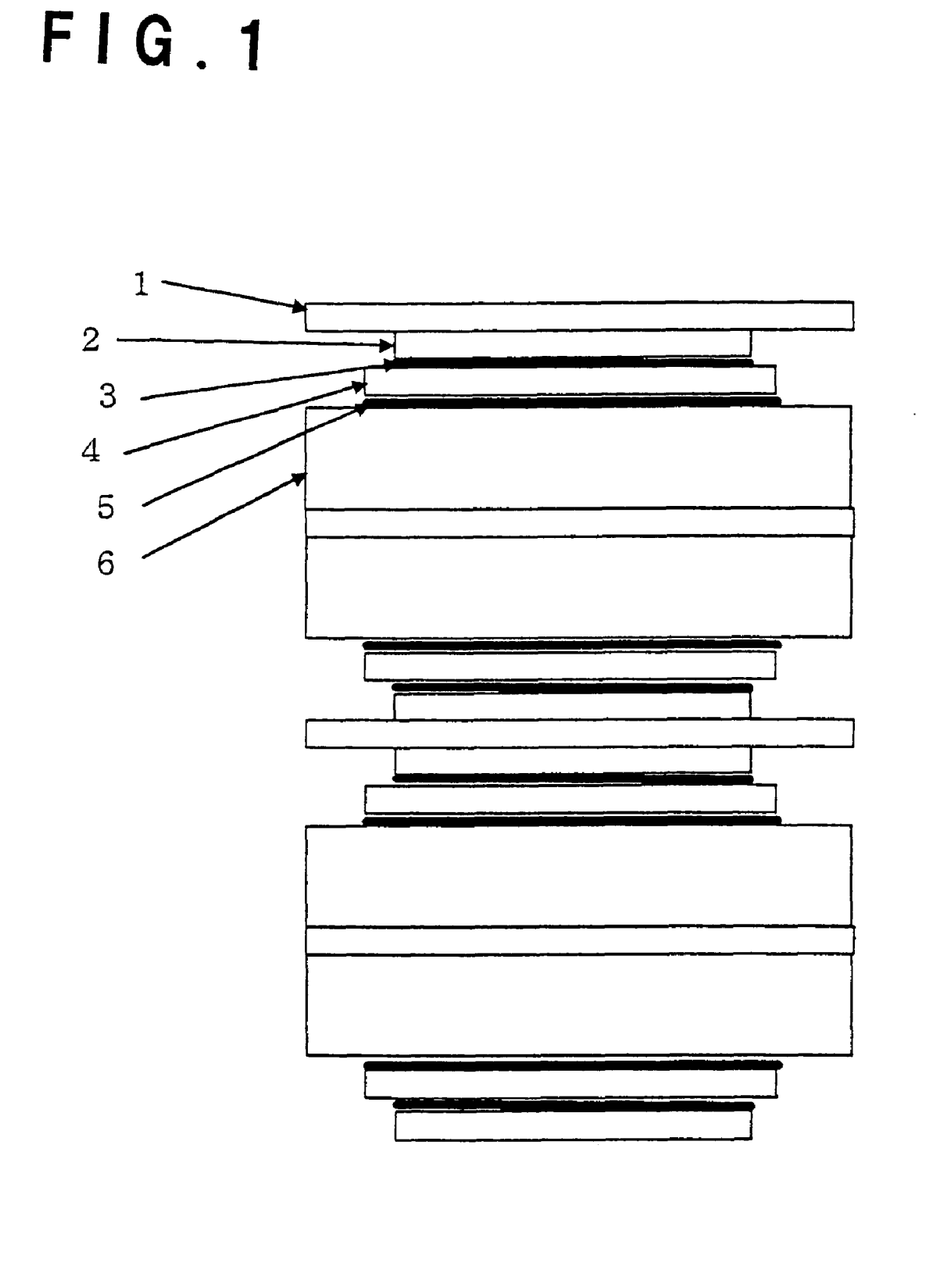
FIG. 1 is a diagram illustrating the process for producing a circuit substrate composite.

A heat sink 6 (commercially available Al/SiC composite having a size of 50 mm×50 mm and a thickness of 3 mm) and an Al circuit 2 (circuit pattern stamped out from a commercially available Al material (purity: at least 99.99 wt %)) were laminated on either side of the obtained aluminum nitride substrate by means of a bonding material 3,5 as shown in Table 7, as illustrated in FIG. 1. In FIG. 1, the numeral 1 indicates a carbon spacer. The obtained laminate was heated in a furnace while applying pressure thereto in a direction perpendicular to the aluminum nitride substrate by means of a carbon push rod by using a hydraulic monoaxial pressurizing apparatus from outside of the furnace, for bonding. The bonding was carried out under vacuum of $4×10^{-3}$Pa (batch type furnace) or in $N_2$ gas (continuous furnace) under conditions as shown in Table 8.

With respect to the obtained circuit substrate composite, the bonding state was observed by a supersonic flaw detector (SAT), and one wherein non-bonded portion having a diameter of 1 mm or larger or a non-bonded portion area of at least 1% was found, was rated as bonding failure. Then, each sample was subjected to heat cycle test for 3000 cycles and 5000 cycles, each cycle comprises 30 minutes at −40° C., 10 minutes at room temperature, 30 minutes at 125° C. and 10 minutes at room temperature, whereupon the appearance was observed to confirm the presence or absence of cracks, and then the bonding state was checked again by SAT. The results are shown in Table 9.

TABLE 6

| Ex. | $Y_2O_3$ addition amount (wt %) | Baking condition Temp. (° C.) | Time (hrs) | X-ray diffraction* X | Y | Z | Thermal conductivity (W/mK) |
|---|---|---|---|---|---|---|---|
| 19 | 4.7 | 1775 | 12.5 | 0 | 5 | 1 | 187 |
| 20 | 3.5 | 1800 | 8 | 0 | 6 | 0 | 176 |
| 21 | 2.8 | 1815 | 2.5 | 1 | 9 | 0 | 164 |

*X = 100 × $3Y_2O_3.5Al_2O_3$ peak intensity/AlN peak intensity
Y = 100 × $Y_2O_3.Al_2O_3$ peak intensity/AlN peak intensity
Z = 100 × $2Y_2O_3.Al_2O_3$ peak intensity/AlN peak intensity

TABLE 7

| Ex. | Bonding material Composition | Thickness (mm) | Thickness of Al circuit (mm) |
|---|---|---|---|
| 19 | 95.0 wt % Al-4.0 wt % Cu-1.0 wt % Mg | 0.03 | 0.4 |
| 20 | 93.5 wt % Al-5.0 wt % Cu-1.5 wt % Mg | 0.015 | 0.5 |
| 21 | 95.3 wt % Al-3.5 wt % Cu-1.2 wt % Mg | 0.025 | 0.4 |

TABLE 8

| Ex. | Atmosphere | Bonding condition Temp. (° C.) | Time (min) | Pressure (kgf/cm²) |
|---|---|---|---|---|
| 19 | $N_2$ | 615 | 10 | 35 |
| 20 | Vacuum | 600 | 20 | 45 |
| 21 | $N_2$ | 620 | 3 | 15 |

TABLE 9

| Ex. | Initial number of failures Appearance | SAT | Number of failures after 3000 cycles Appearance | SAT | Number of failures after 5000 cycles Appearance | SAT |
|---|---|---|---|---|---|---|
| 19 | No flaw | 0/10 | No flaw | 0/10 | No flaw | 0/10 |
| 20 | No flaw | 0/10 | No flaw | 0/10 | No flaw | 1/10 |
| 21 | No flaw | 0/10 | Solder crack: 1/10 | 1/10 | Solder crack: 5/10 | 3/10 |

As evident from Tables 6 to 9, by using the aluminum nitride substrate having a thermal conductivity of at least 130 W/mK and such a X-ray diffraction peak intensity ratio on the substrate surface that $2 \leq Y_2O_3.Al_2O_3×100/AlN \leq 17$ and $2Y_2O_3.Al_2O_3×100/AlN \leq 2$, circuit substrate composites showing an excellent bonding state and having few cracks even after the heat cycle test for 5000 cycles, were obtained. Particularly, in Examples 19 and 21, circuit substrate composites having few bonding failures could be produced even by using the simplified continuous furnace.

EXAMPLES 22 TO 25

An Al plate for an Al circuit and an Al plate for a heat-radiating plate were overlaid respectively on the front and on the back of the aluminum nitride substrate used in Example 8 by means of a bonding material as shown in Table 10, and bonding was carried out under bonding conditions as shown in Table 11.

After the bonding, etching resists were printed by screen printing, followed by etching by a $FeCl_3$ liquid. Patterns for an Al circuit and a heat-radiating plate were squares (corner R: 2 mm), which were formed on the center portion of the ceramic substrate. Their sizes were variously changed to adjust the volume ratio of the Al circuit to the heat-radiating plate as shown in Table 10. Then, the resists were peeled, and electroless Ni—P plating was applied in a thickness of 3 μm on either side to obtain a circuit substrate.

By using some of the obtained circuit substrates, the Al circuit and the heat-radiating plate were peeled to measure their Vickers hardnesses. Further, a Si chip of 13 mm square was soldered on the center portion of each of some circuit substrates, and heat cycle test was carried out in the same manner as in Example 19. The results are shown in Table 12.

to be from 1 to 6 wt %, by quantification of the peak ratio in elemental analysis by cross section observation.

According to the present invention, a highly reliable circuit substrate useful for power modules can be provided stably at a low cost.

Further, according to the present invention, a highly reliable circuit substrate with few solder cracks and cracks on a ceramic substrate, can be provided.

Still further, according to the present invention, a highly reliable circuit substrate composite (circuit substrate with heat sink) having a light weight and excellent heat-radiating properties, can be provided.

The entire disclosure of Japanese Patent Application No. 11-149302 filed on May 28, 1999 including specification, claims, drawings and summary are incorporated herein by reference in its entirety.

TABLE 10

| Ex. | Bonding material Composition | Thickness (mm) | Al plate for Al circuit Thickness (mm) | Type* | Al plate for heat-radiating plate Thickness (mm) | Type* | Volume ratio (Al circuit)/ (heat-radiating plate) |
|---|---|---|---|---|---|---|---|
| 22 | 95.0 wt % Al-4.0 wt % Cu-1.0 wt % Mg | 0.02 | 0.4 | At least 99.99 wt % | 0.4 | At least 99.3 wt % | 0.90 |
| 23 | 94.2 wt % Al-4.5 wt % Cu-0.8 wt % Mg-0.5 wt % Mn | 0.02 | 0.5 | At least 99.99 wt % | 0.4 | At least 99.5 wt % | 1.05 |
| 24 | 93.5 wt % Al-5.0 wt % Cu-1.5 wt % Mg | 0.015 | 0.5 | At least 99.9 wt % | 0.5 | Al-0.5 wt % Si alloy | 0.88 |
| 25 | 95.3 wt % Al-3.5 wt % Cu-1.2 wt % Mg | 0.025 | 0.4 | At least 99.85 wt % | 0.5 | Al-0.3 wt % Mg alloy | 1.12 |

*Al purity: guaranteed performance by a maker

TABLE 11

| | Bonding condition | | | Vickers hardness (kgf/mm²) | |
|---|---|---|---|---|---|
| Ex. | Bonding temp. | Time | Atmosphere | Al circuit | Heat-radiating plate |
| 22 | 625° C. | 10 min | N₂ | 14.8 | 23.9 |
| 23 | 615° C. | 15 min | Vacuum | 13.7 | 22.3 |
| 24 | 595° C. | 5 min | Vacuum | 15.4 | 27.2 |
| 25 | 635° C. | 20 min | Vacuum | 16.3 | 28.7 |

TABLE 12

| | Number of failures after 3000 cycles | | | Number of failures after 5000 cycles | | |
|---|---|---|---|---|---|---|
| Ex. | Substrate | Solder under chip (SAT) | Solder under substrate (SAT) | Substrate | Solder under chip (SAT) | Solder under substrate (SAT) |
| 22 | 0/10 | 0/10 | 0/10 | 0/10 | 0/10 | 0/10 |
| 23 | 0/10 | 0/10 | 0/10 | 1/10 | 0/10 | 1/10 |
| 24 | 1/10 | 0/10 | 0/10 | 3/10 | 3/10 | 3/10 |
| 25 | 0/10 | 0/10 | 1/10 | 0/10 | 5/10 | 5/10 |

As evident from the comparison between Examples 22 to 24 and Example 25, with respect to the circuit substrates having a volume ratio of the Al circuit to the heat-radiating plate of from 0.80 to 1.2, by making the Vickers hardness of the Al circuit at most 16 kgf/mm² and the Vickers hardness of the heat-radiating plate from 19 to 30 kgf/mm², the solder cracks and substrate cracks could be significantly suppressed even after 5000 cycles.

Here, in Examples 13 to 25, the Cu content in the layer comprising Al and Cu in each bonded layer was confirmed

What is claimed is:

1. A circuit substrate which has a ceramic substrate and an Al circuit comprising Al or an Al alloy bonded to said ceramic substrate via a layer comprising Al and Cu, wherein the layer comprising Al and Cu has an amount of Cu ranging from 1 to 6 wt %.

2. The circuit substrate according to claim 1, wherein the ceramic substrate is an aluminum nitride substrate or a silicon nitride substrate.

3. The circuit substrate according to claim 1, wherein the ceramic substrate is an aluminum nitride substrate having a thermal conductivity of at least 130 W/mK and having such a X-ray diffraction peak intensity ratio that $2 \leq Y_2O_3.Al_2O_3 \times 100/AlN \leq 17$ and $2Y_2O_3.Al_2O_3 \times 100/AlN \leq 2$ on the surface.

4. The circuit substrate according to claim 1, wherein is the Al circuit comprising Al or an Al alloy is formed by using Al having a purity of at least 99.85 wt %.

5. The circuit substrate according to claim 1, wherein the Al circuit comprising Al or an Al alloy is formed by using a rolled Al having a purity of at least 99.99 wt %.

6. The circuit substrate according to claim 1, wherein the Al circuit comprising Al ornd a Al alloy has a thickness of at least 100 μm and a Vickers hardness of at most 15 kgf/mm².

7. The circuit substrate according to claim 1, which has a heat-radiating plate comprising Al or an Al alloy formed on the ceramic substrate on the side (back side) opposite to the side on which the Al circuit is formed.

8. The circuit substrate according to claim 7, wherein the volume ratio of the Al circuit to the heat-radiating plate is from 0.80 to 1.2.

9. The circuit substrate according to claim 7, wherein the Al circuit has a Vickers hardness of at most 16 kgf/mm² and the heat-radiating plate has a Vickers hardness of from 19 to 30 kgf/mm².

10. A circuit substrate which has a ceramic substrate and an Al circuit comprising Al or an Al alloy bonded to said ceramic substrate via a bonding material comprising an Al—Cu type alloy or a mixture containing Al and Cu, wherein the bonding material comprises at least 86 wt % of Al, from 1 to 6 wt % of Cu and at most 3 wt % of Mg (not including O).

11. The circuit substrate according to claim 10, wherein the bonding material is an Al—Cu type alloy foil.

12. The circuit substrate according to claim 10, wherein the ceramic substrate is an aluminum nitride substrate or a silicon nitride substrate.

13. The circuit substrate according to claim 10, wherein the ceramic substrate is an aluminum nitride substrate having a thermal conductivity of at least 130 W/mK and having such a X-ray diffraction peak intensity ratio that $2 \leq Y_2O_3 \cdot Al_2O_3 \times 100/AlN \leq 17$ and $2Y_2O_3 \cdot Al_2O_3 \times 100/AlN \leq 2$ surface.

14. The circuit substrate according to claim 10, wherein the Al circuit comprising Al or an Al alloy is formed by using Al having a purity of at least 99.85 wt %.

15. The circuit substrate according to claim 10, wherein the Al circuit comprising Al or an Al alloy is formed by using a rolled Al having a purity of at least 99.99 wt %.

16. The circuit substrate according to claim 10, wherein the Al circuit comprising Al or an Al alloy has a thickness of at least 100 $\mu$m and a Vickers hardness of at most 15 kgf/mm$^2$.

17. The circuit substrate according to claim 10, which has a heat-radiating plate comprising Al or an Al alloy formed on the ceramic substrate on the side (back side) opposite to the side on which the Al circuit is formed.

18. The circuit substrate according to claim 17, wherein the volume ratio of the Al circuit to the heat-radiating plate is from 0.80 to 1.2.

19. The circuit substrate according to claim 17, wherein the Al circuit has a Vickers hardness of at most 16 kgf/mm$^2$, and the heat-radiating plate has a Vickers hardness of from 19 to 30 kgf/mm$^2$.

20. A process for producing the circuit substrate according claim 1 or claim 12, which comprises disposing an Al or Al alloy plate, pattern or both on a ceramic substrate by means of, as a bonding material, an Al—Cu type alloy or a mixture containing Al and Cu, and heating the resulting assembly at a temperature of from 540 to 640° C. while applying a pressure of from 1 to 100 kgf/cm$^2$ thereto in a direction perpendicular to the ceramic substrate to bond the Al or Al alloy plate, pattern or both to the ceramic substrate, followed by etching as the case requires.

21. The process for producing a circuit substrate according to claim 20, wherein the bonding material is an Al—Cu type alloy foil.

22. The process for producing a circuit substrate according to claim 21, wherein the bonding material is an Al—Cu type alloy foil having a thickness of from 15 to 35 $\mu$m, the Al or Al alloy plate, pattern or both, having a thickness of at least 100 $\mu$m, is disposed on either side of the ceramic substrate by means of said bonding material, and the resulting assembly is held under heating at a temperature of at least 590° C. for at least 20 minutes while applying a pressure of from 8 to 50 kgf/cm$^2$ thereto in a direction perpendicular to the ceramic substrate.

23. The process for producing a circuit substrate according to claim 21, wherein the Al—Cu type alloy foil is an Al—Cu—Mg type alloy foil comprising at least 86 wt % of Al, from 1 to 6 wt % of Cu and at most 3 wt % of Mg (not including O).

24. The process for producing a circuit substrate according to claim 22, wherein the Al—Cu type alloy foil is an Al—Cu—Mg type alloy foil comprising at least 86 wt % of Al, from 1 to 6 wt % of Cu and at most 3 wt % of Mg (not including O).

* * * * *

UNITED STATES PATENT AND TRADEMARK OFFICE
CERTIFICATE OF CORRECTION

PATENT NO. : 6,309,737 B1
DATED : October 30, 2001
INVENTOR(S) : Yutaka Hirashima et al.

It is certified that error appears in the above-identified patent and that said Letters Patent is hereby corrected as shown below:

<u>Column 18,</u>
Line 4, "12" should be -- 10 --.

Signed and Sealed this

Third Day of June, 2003

JAMES E. ROGAN
*Director of the United States Patent and Trademark Office*